(12) United States Patent
Park et al.

(10) Patent No.: US 11,404,458 B2
(45) Date of Patent: Aug. 2, 2022

(54) IMAGE SENSOR INCLUDING QUANTUM DOT LAYER

(71) Applicant: Industry-University Cooperation Foundation Hanyang University, Seoul (KR)

(72) Inventors: Jea Gun Park, Seongnam-si (KR); Il Hwan Kim, Seoul (KR); Jun Seong Park, Anyang-si (KR); Yun Hyuk Koh, Daejeon (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 819 days.

(21) Appl. No.: 16/081,810

(22) PCT Filed: Apr. 20, 2018

(86) PCT No.: PCT/KR2018/004620
§ 371 (c)(1),
(2) Date: Aug. 31, 2018

(87) PCT Pub. No.: WO2019/035530
PCT Pub. Date: Feb. 21, 2019

(65) Prior Publication Data
US 2021/0210531 A1   Jul. 8, 2021

(30) Foreign Application Priority Data

Aug. 14, 2017 (KR) .......................... 10-2017-0103143

(51) Int. Cl.
*H01L 27/146* (2006.01)
*H04N 13/239* (2018.01)
(Continued)

(52) U.S. Cl.
CPC .......... *H01L 27/1461* (2013.01); *C09K 11/08* (2013.01); *H01L 27/14607* (2013.01);
(Continued)

(58) Field of Classification Search
CPC ......... H01L 27/14618; H01L 27/14621; H01L 27/14627; H04N 5/2258; H04N 13/239; H04N 9/04557; C09K 11/08
See application file for complete search history.

(56) References Cited

U.S. PATENT DOCUMENTS 9,635,325 B2   4/2017   Borthakur
9,964,806 B2 *  5/2018   Jang .................. G02F 1/133504
(Continued)

FOREIGN PATENT DOCUMENTS

JP   2004-207285 A   7/2004
JP   2006-216560 A   8/2006
(Continued)

OTHER PUBLICATIONS

Ludong Li et al., "ZnO Quantum Dot Decorated Zn2SnO4 Nanowire Heterojunction Photodetectors with Drastic Performance Enhancement and Flexible Ultraviolet Image Sensors", ASC nano, 2017, pp. 4067-4076, vol. 11, No. 4.
(Continued)

*Primary Examiner* — David A Zarneke
(74) *Attorney, Agent, or Firm* — Sughrue Mion, PLLC

(57) ABSTRACT

The present invention discloses an image sensor including a quantum dot layer. The image sensor including a quantum dot layer according to the present invention includes photoelectric conversion elements formed on a substrate to correspond to a plurality of pixel regions; a wiring layer formed on the substrate on which the photoelectric conversion elements are formed; color filters formed on the wiring layer to correspond to the photoelectric conversion ele-
(Continued)

ments; and a quantum dot layer formed on the color filters and absorbing light and emitting visible light having a specific range of wavelengths converted from the absorbed light.

10 Claims, 13 Drawing Sheets

(51) Int. Cl.
  *C09K 11/08* (2006.01)
  *H04N 5/225* (2006.01)
  *H04N 9/04* (2006.01)
(52) U.S. Cl.
  CPC .. *H01L 27/14618* (2013.01); *H01L 27/14621* (2013.01); *H01L 27/14627* (2013.01); *H01L 27/14643* (2013.01); *H04N 5/2258* (2013.01); *H04N 9/04557* (2018.08); *H04N 13/239* (2018.05)

(56) References Cited

U.S. PATENT DOCUMENTS

| | | |
|---|---|---|
| 2011/0116078 A1 | 5/2011 | Cho et al. |
| 2011/0309462 A1 | 12/2011 | Sargent et al. |
| 2012/0126354 A1 | 5/2012 | Jaworski et al. |
| 2015/0311239 A1 | 10/2015 | Won et al. |
| 2018/0299730 A1 | 10/2018 | Saito et al. |

FOREIGN PATENT DOCUMENTS

| | | |
|---|---|---|
| JP | 2007-281820 A | 10/2007 |
| JP | 2010-118491 A | 5/2010 |
| JP | 2014-127443 A | 7/2014 |
| JP | 2016-021488 A | 2/2016 |
| JP | 2017-107174 A | 6/2017 |
| KR | 10-2006-0089099 A | 8/2006 |
| KR | 10-2008-0104574 A | 12/2008 |
| KR | 10-2010-0079088 A | 7/2010 |
| KR | 10-2011-0053796 A | 5/2011 |
| KR | 10-2015-0118885 A | 10/2015 |
| KR | 10-2016-0099995 A | 8/2018 |

OTHER PUBLICATIONS

International Search Report for PCT/KR2018/004620, dated Jul. 27, 2018.
Communication dated Nov. 5, 2019 from Japanese Patent Office in counterpart JP Application No. 2018-545987.
Communication dated May 21, 2020 by the Korean Intellectual Property Office in application No. 10-2020-0007491.
Communication dated Apr. 27, 2020 by the Korean Intellectual Property Office in application No. 10-2020-0007491.
Office Action issued by the Korean Patent Office dated Jul. 30, 2019 for the corresponding Korean Patent Application No. 10-2017-0103143.
Decision to Grant dated Aug. 4, 2020 issued by the Japanese Patent Office in Application No. 2018-545987.

* cited by examiner

[FIG. 1A]
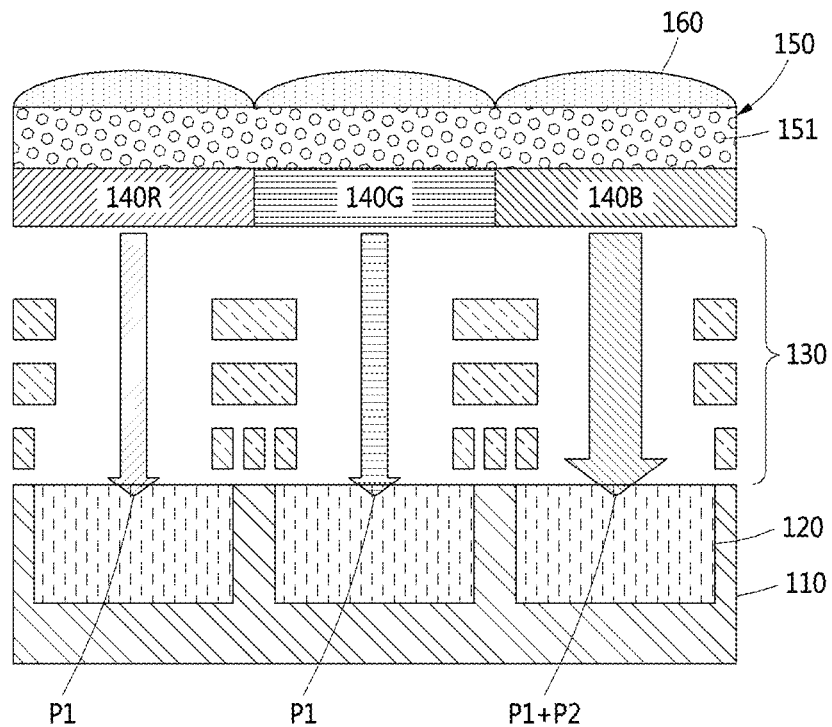
[FIG. 1B]
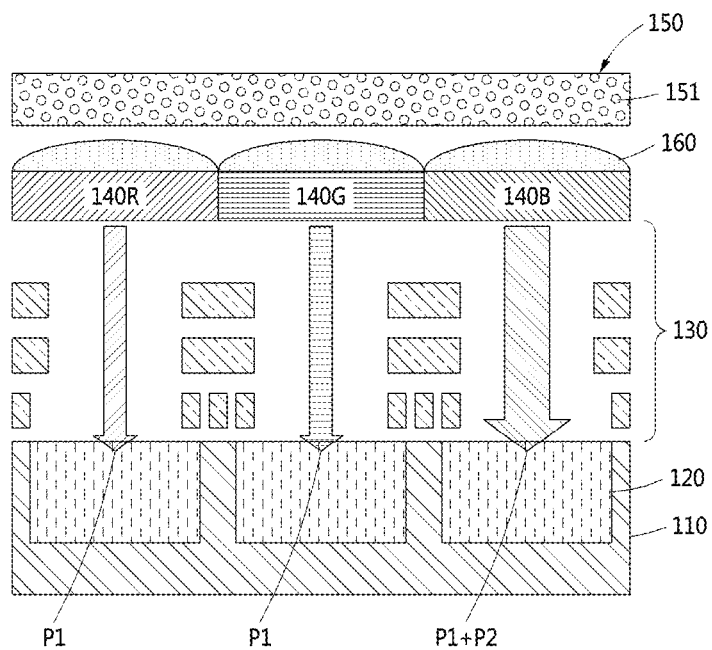

[FIG. 1C]
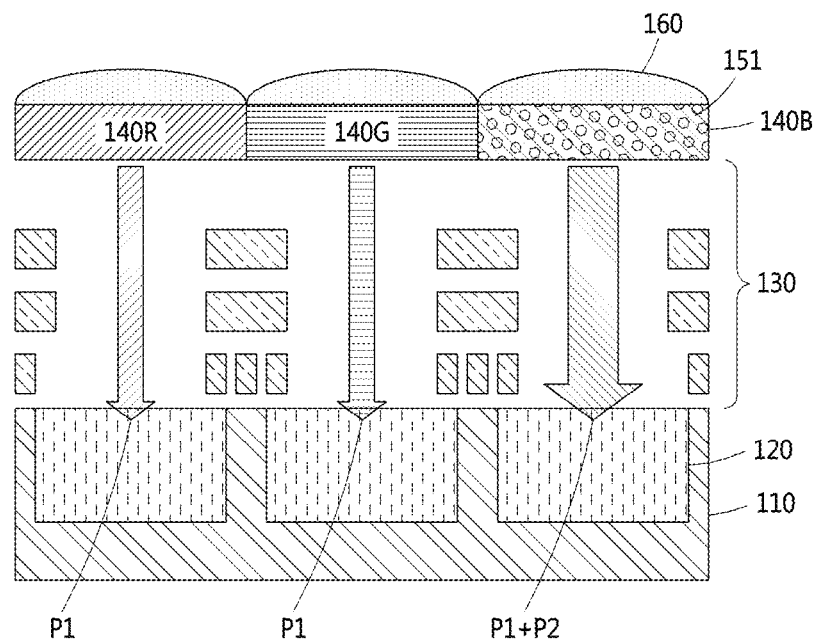
[FIG. 2]
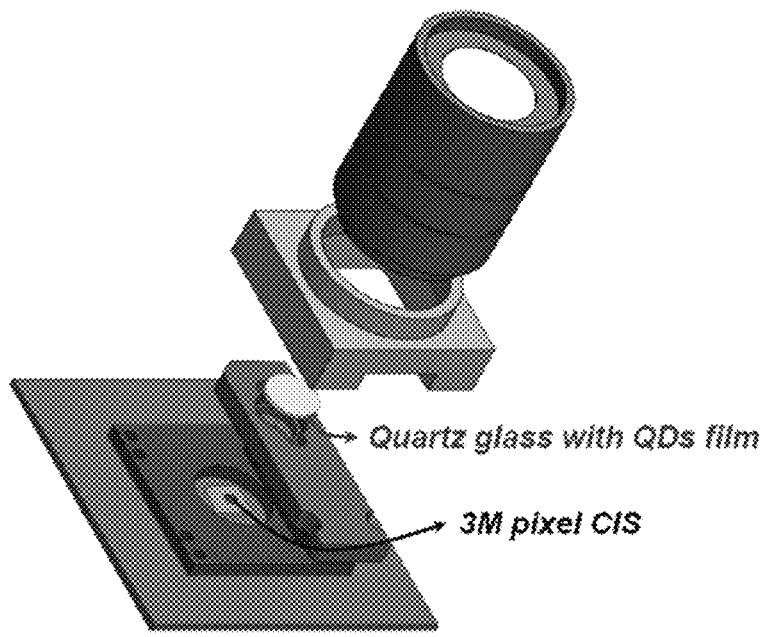

[FIG. 3A]
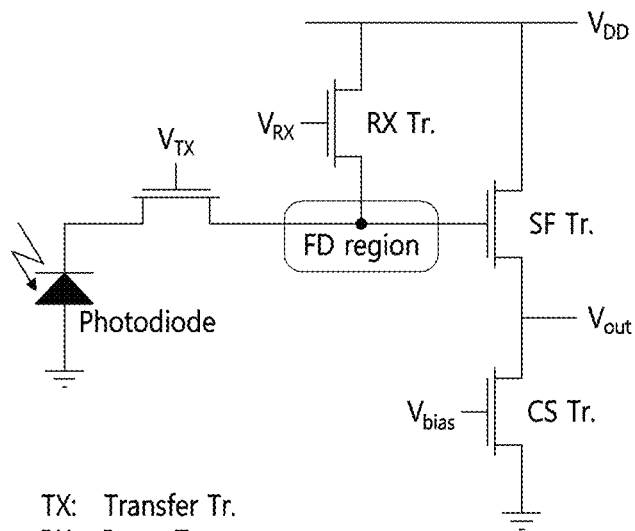
TX: Transfer Tr.
RX: Reset Tr.
SF: Source follower Tr.
CS: Current source Tr.
FD: Floating diffusion region
[FIG. 3B]
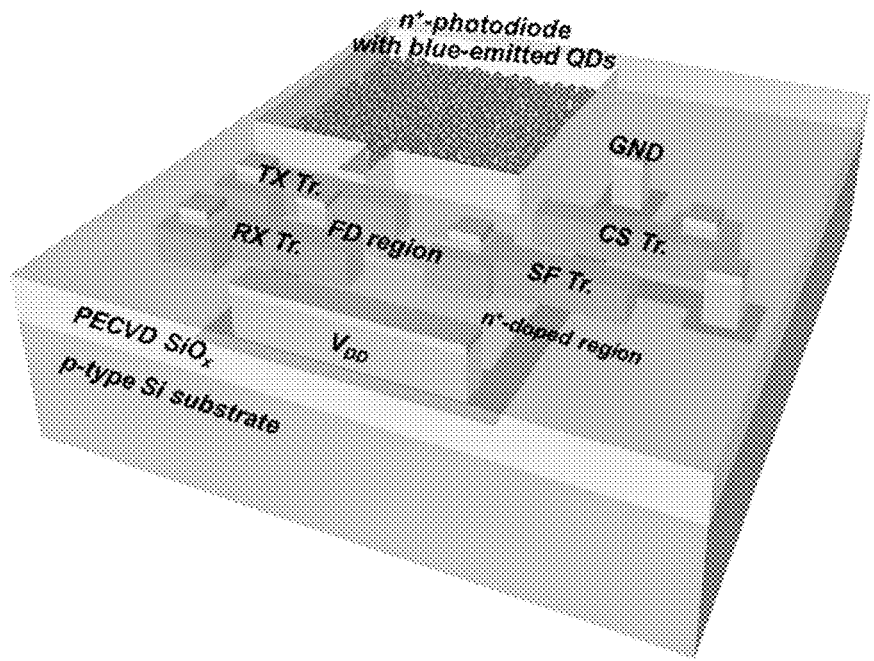

[FIG. 3C]
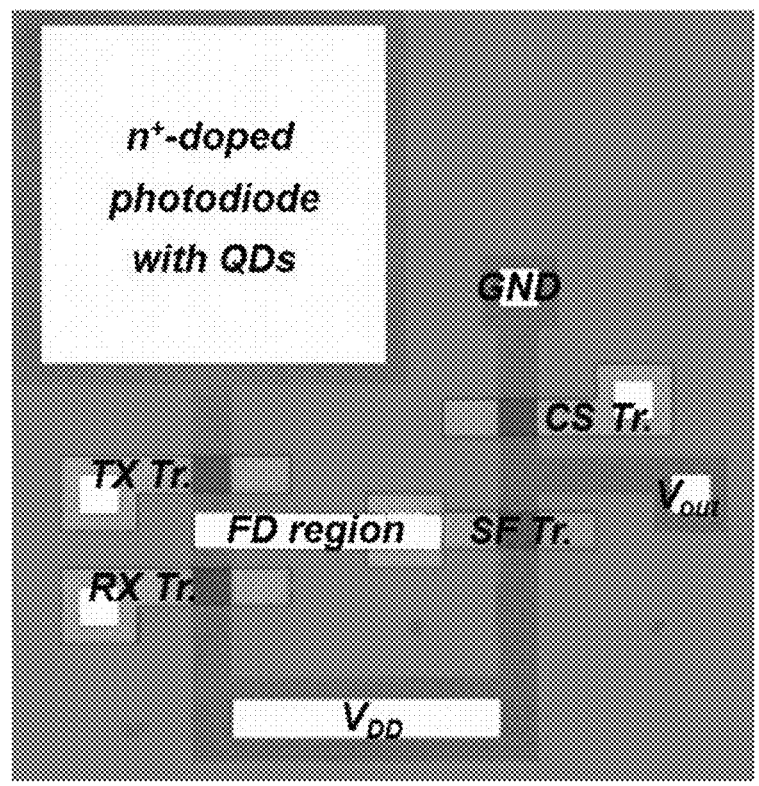
[FIG. 4A]
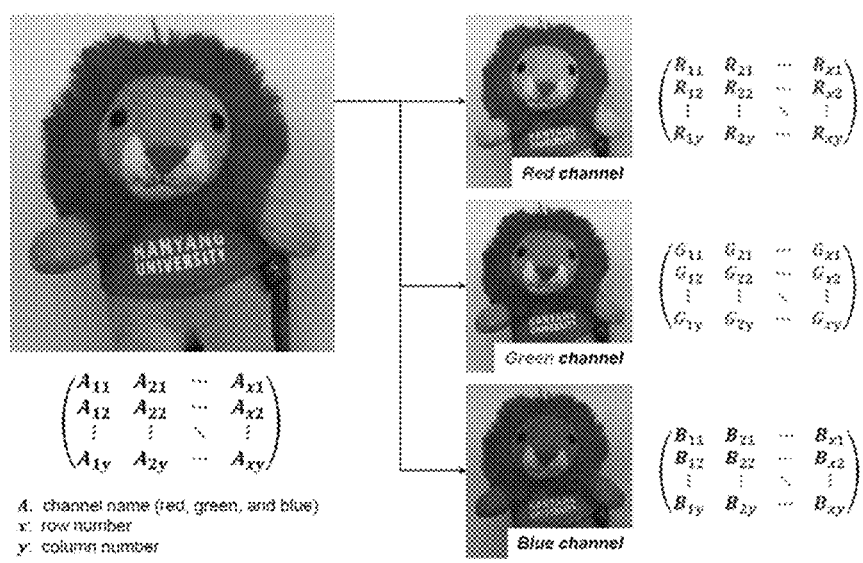

[FIG. 4B]

$$\begin{pmatrix} A_{11,\text{with QD}} & A_{21,\text{with QD}} & \cdots & A_{x1,\text{with QD}} \\ A_{12,\text{with QD}} & A_{22,\text{with QD}} & \cdots & A_{x2,\text{with QD}} \\ \vdots & \vdots & \ddots & \vdots \\ A_{1y,\text{with QD}} & A_{2y,\text{with QD}} & \cdots & A_{xy,\text{with QD}} \end{pmatrix}$$

[FIG. 4C]

$$\begin{pmatrix} A_{11,\text{w/o QD}} & A_{21,\text{w/o QD}} & \cdots & A_{x1,\text{w/o QD}} \\ A_{12,\text{w/o QD}} & A_{22,\text{w/o QD}} & \cdots & A_{x2,\text{w/o QD}} \\ \vdots & \vdots & \ddots & \vdots \\ A_{1y,\text{w/o QD}} & A_{2y,\text{w/o QD}} & \cdots & A_{xy,\text{w/o QD}} \end{pmatrix}$$

[FIG. 4D]

$$\begin{pmatrix} A_{11,\text{with QD}} - A_{11,\text{w/o QD}} & A_{21,\text{with QD}} - A_{21,\text{w/o QD}} & \cdots & A_{x1,\text{w/o QD}} - A_{x1,\text{w/o QD}} \\ A_{12,\text{with QD}} - A_{12,\text{w/o QD}} & A_{22,\text{with QD}} - A_{22,\text{w/o QD}} & \cdots & A_{x2,\text{with QD}} - A_{x2,\text{w/o QD}} \\ \vdots & \vdots & \ddots & \vdots \\ A_{1y,\text{with QD}} - A_{1y,\text{w/o QD}} & A_{2y,\text{with QD}} - A_{2y,\text{w/o QD}} & \cdots & A_{xy,\text{with QD}} - A_{xy,\text{w/o QD}} \end{pmatrix}$$

[FIG. 5]
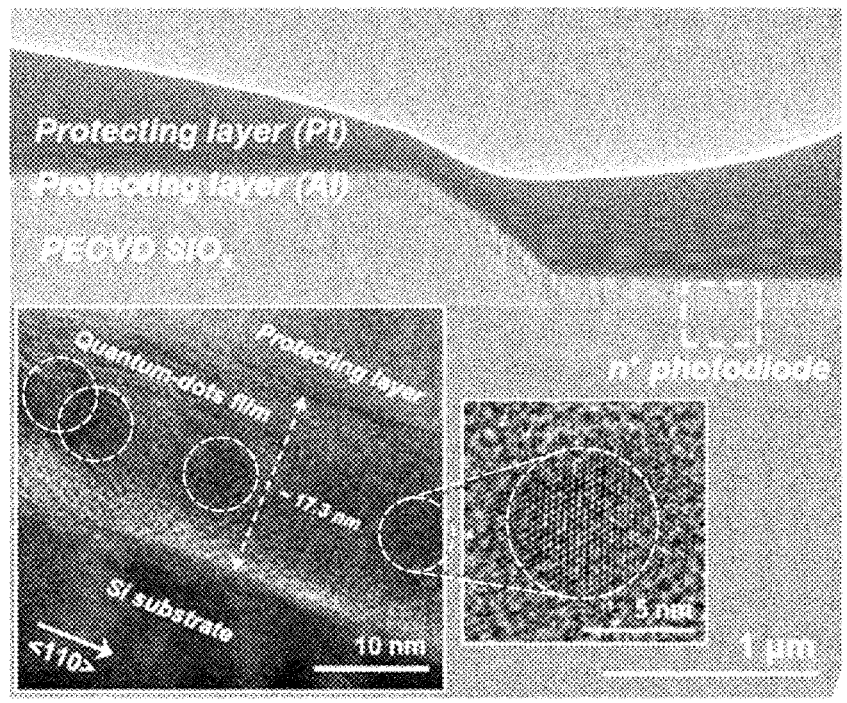
[FIG. 6]
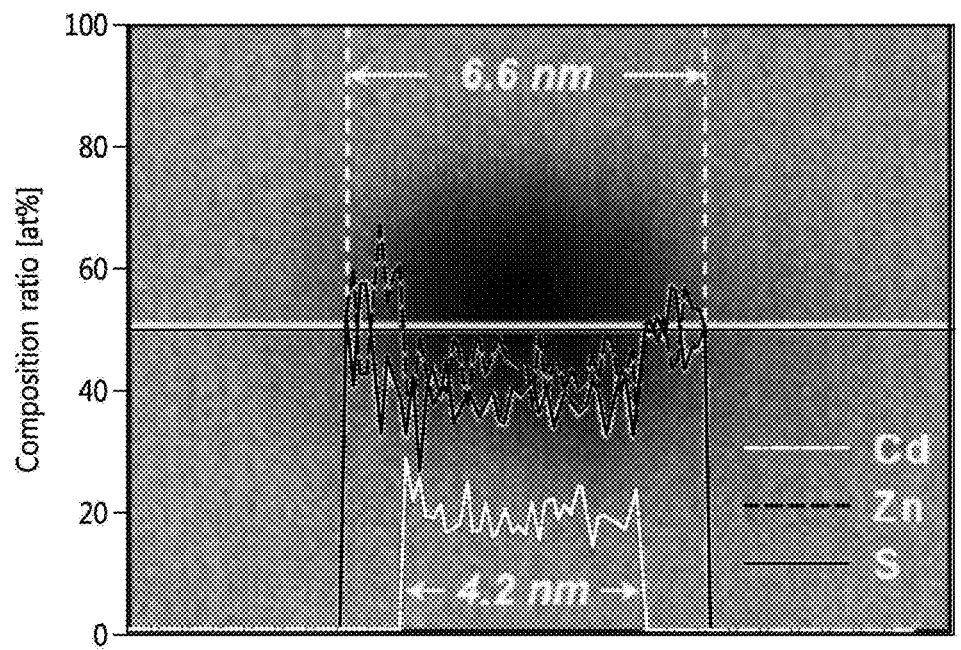

[FIG. 7]
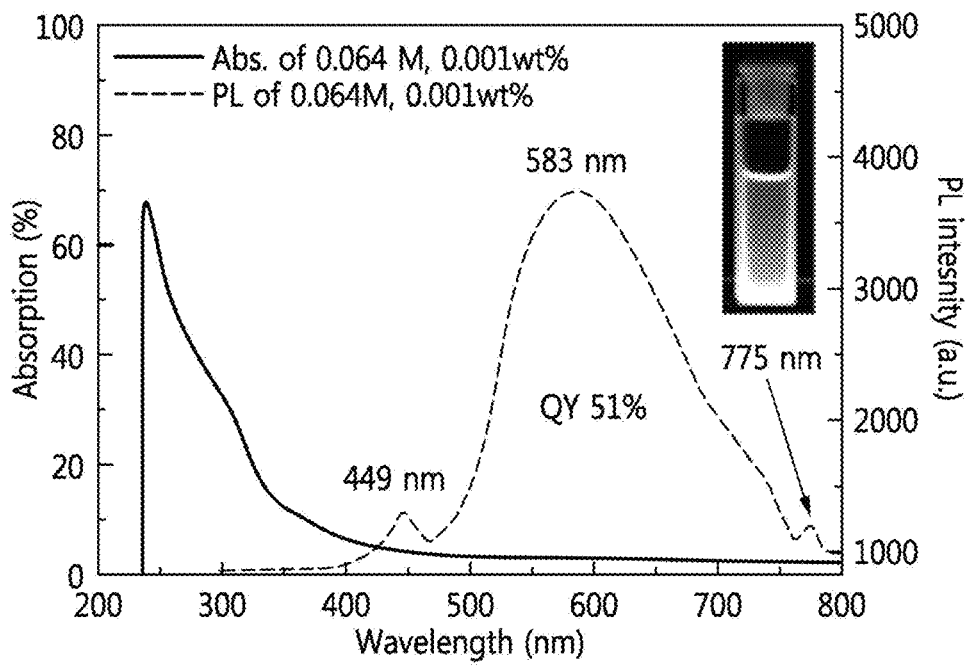
[FIG. 8]
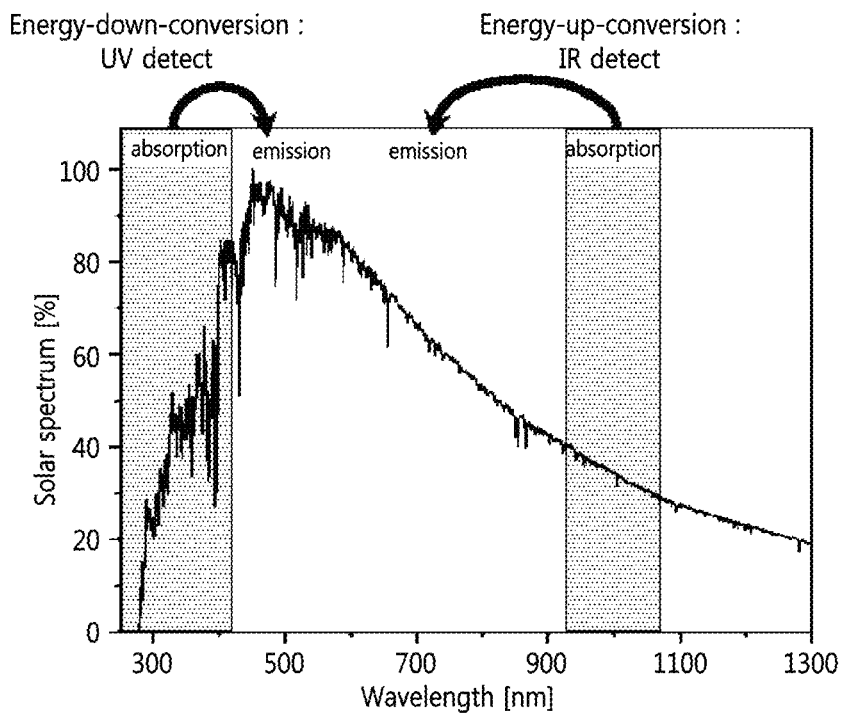

[FIG. 9]
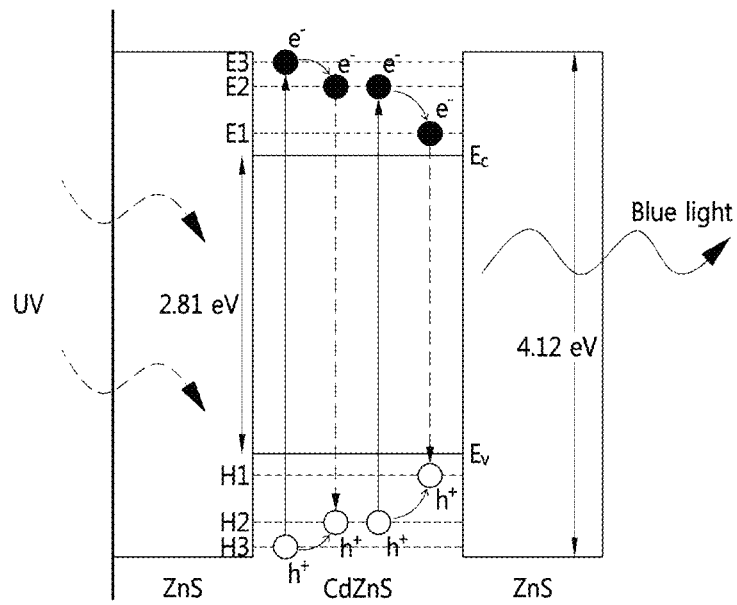
[FIG. 10]
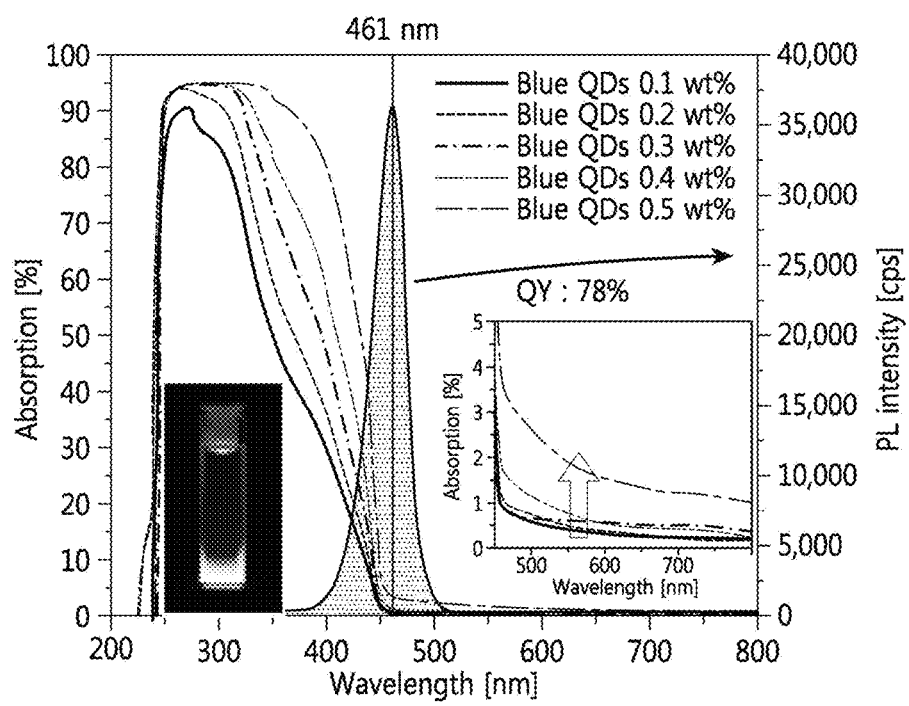

[FIG. 11]
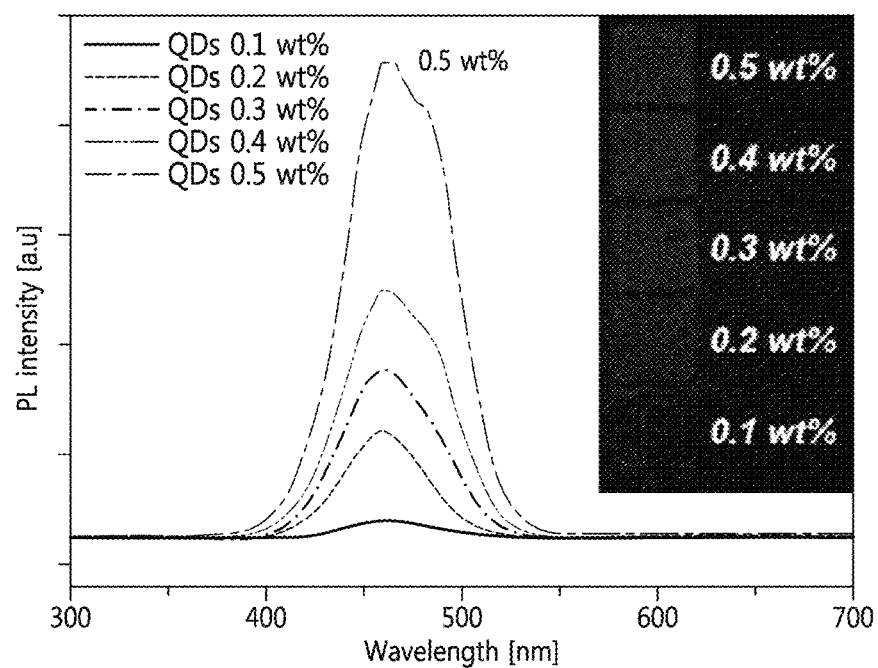
[FIG. 12]
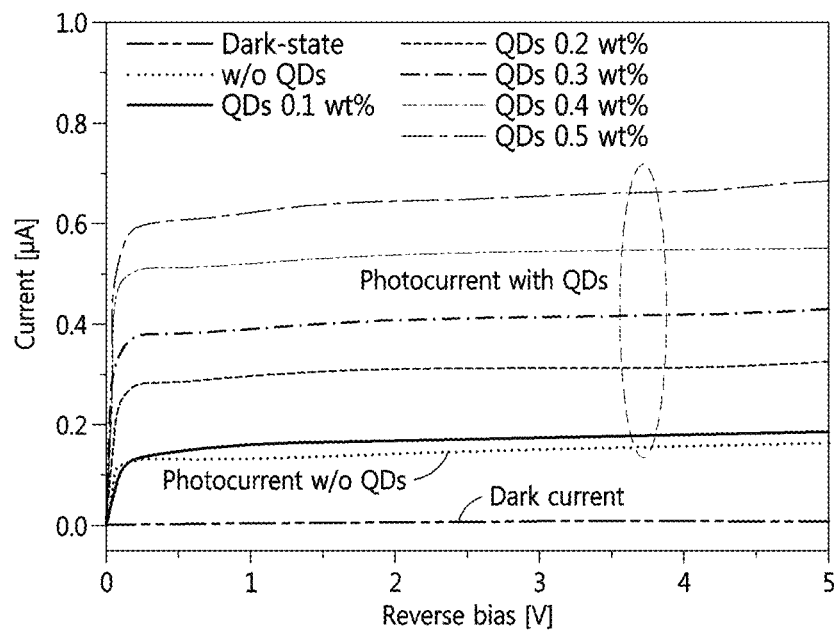

[FIG. 13]
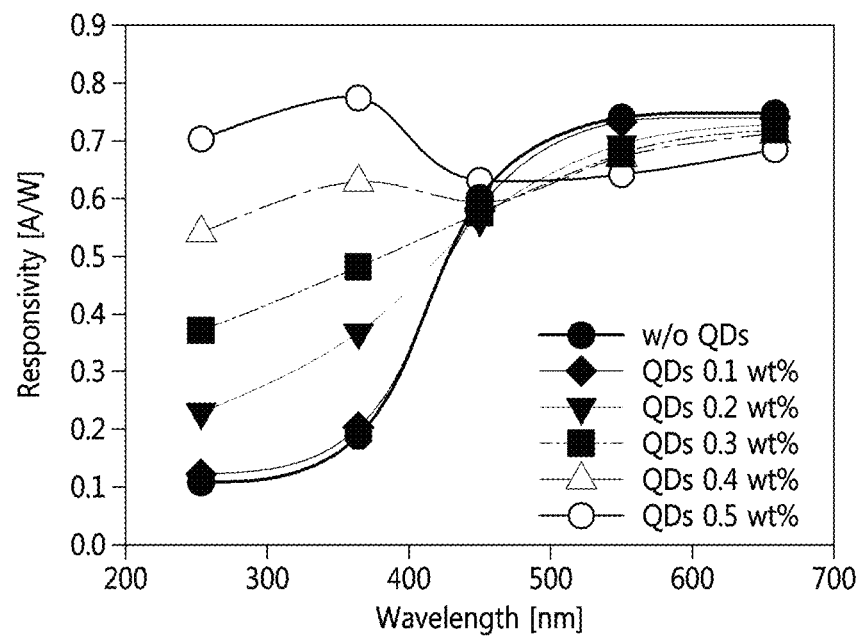
[FIG. 14]
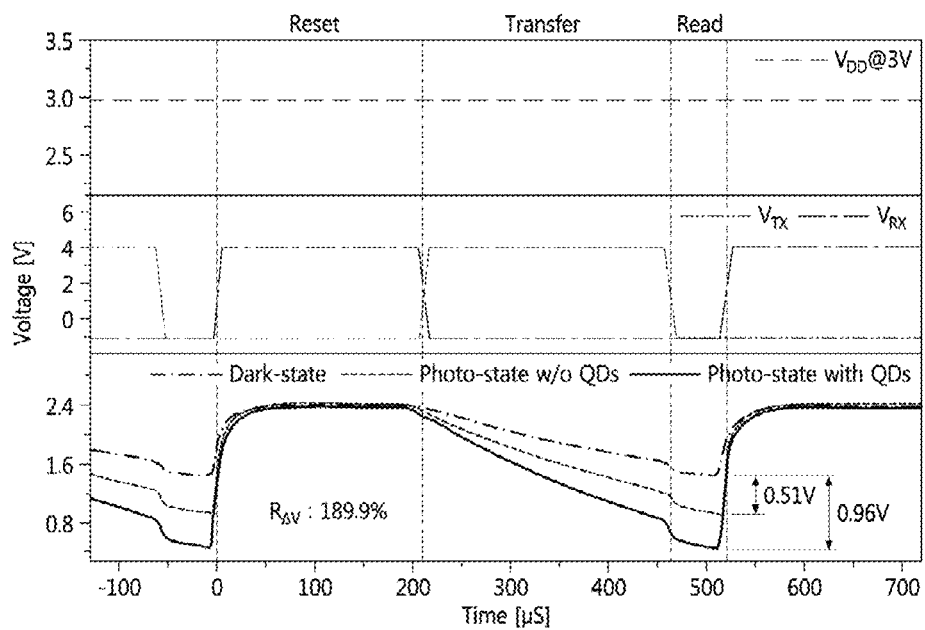

[FIG. 15]
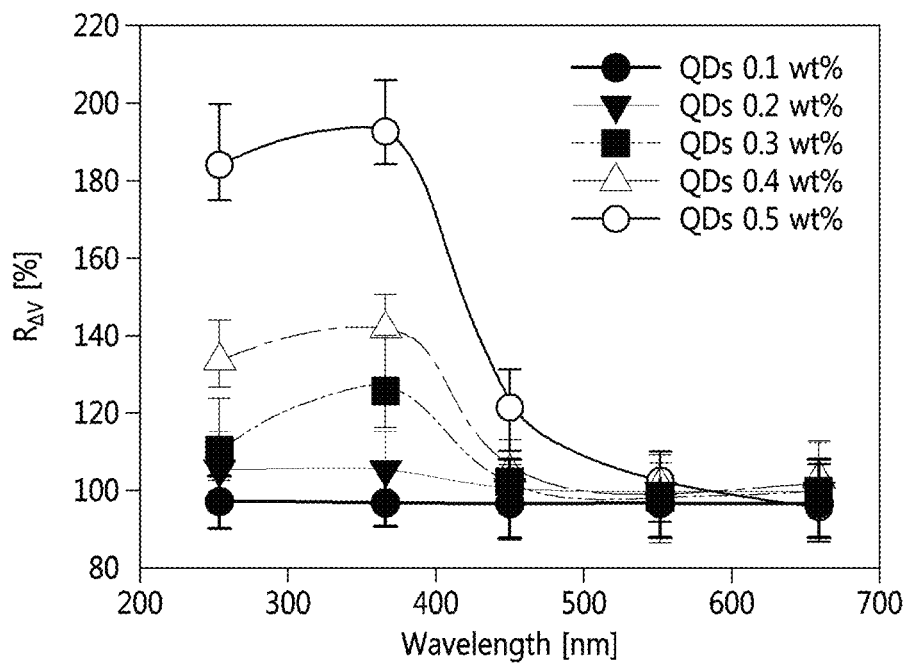
[FIG. 16]
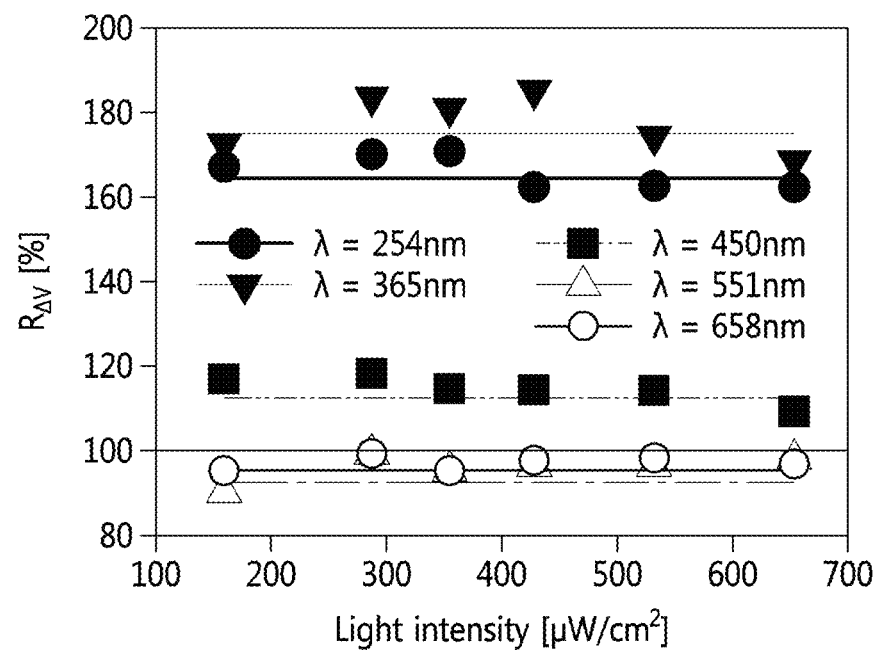

[FIG. 17A]
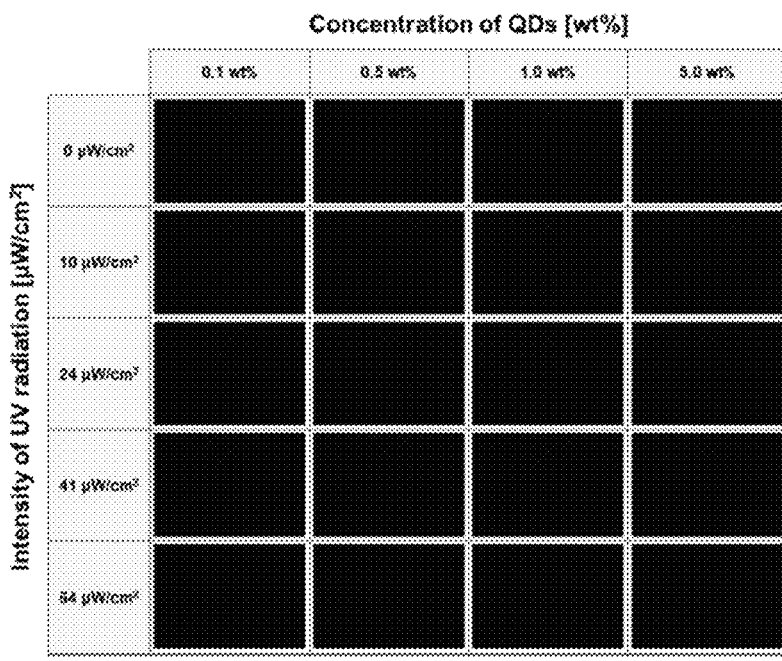
[FIG. 17B]
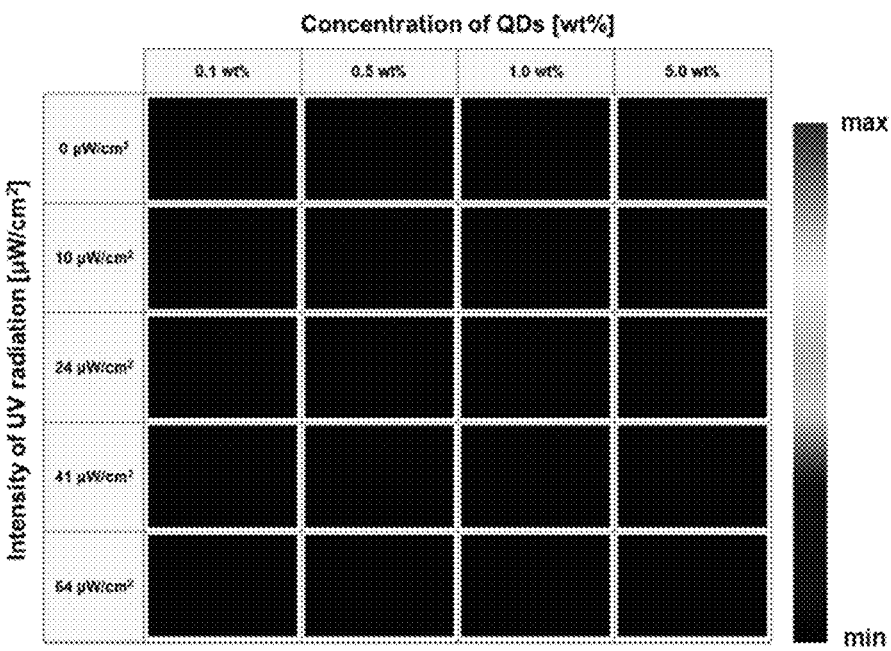

[FIG. 17C]
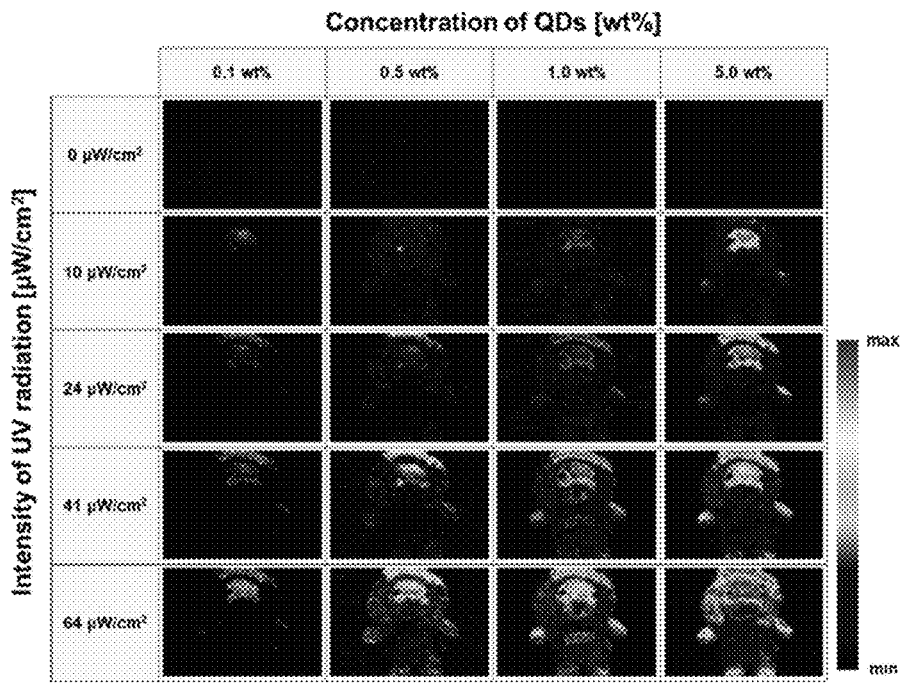
[FIG. 18]
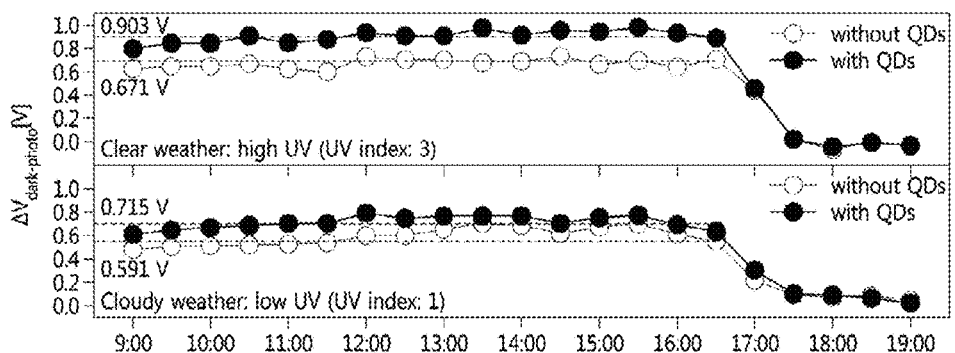
[FIG. 19]
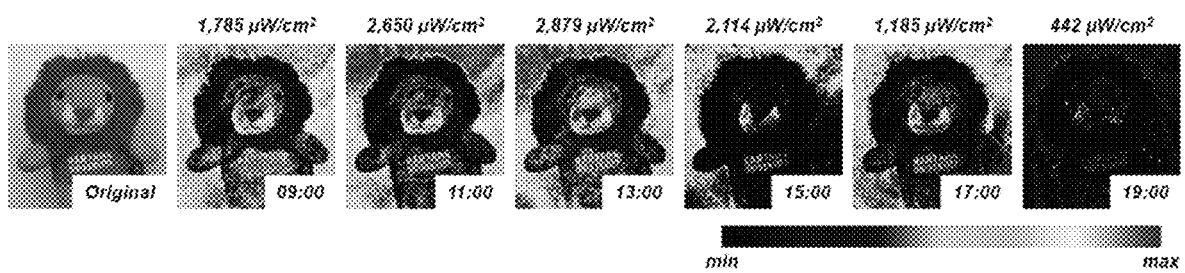

IMAGE SENSOR INCLUDING QUANTUM DOT LAYER

CROSS-REFERENCE TO RELATED APPLICATION

This application claims priority to Korean Patent Application No. 10-2017-0103143, filed on Aug. 14, 2017 in the Korean Intellectual Property Office, the disclosure of which is incorporated herein by reference.

TECHNICAL FIELD

The present invention relates to an image sensor including a quantum dot layer, and more particularly, to an image sensor including a quantum dot layer capable of displaying ultraviolet or infrared light.

BACKGROUND ART

In recent years, in accordance with development of the computer industry and the communication industry, demand for image sensors with improved performance in various fields, such as digital cameras, camcorders, personal communication systems (PCSs), game consoles, security cameras, and medical micro cameras, is increasing.

In general, image sensors are classified into charge-coupled device (CCD) and complementary metal-oxide-semiconductor (CMOS) image sensors. In the CCD image sensor, electrons generated by light are directly transferred to an output portion using gate pulses. Therefore, even if voltage changes due to external noise during electron transfer, the number of electrons does not change, so that the output signal is not affected by noise. Because of these characteristics, CCD image sensors are widely used in multimedia devices requiring high image quality, such as digital cameras and camcorders.

In the case of CMOS image sensors, the driving method is easy, and signal processing circuits can be integrated on a single chip, thereby enabling miniaturization of the product. Also, due to very low power consumption, CMOS image sensors are suitable for products with limited battery capacity. In addition, in manufacturing a CMOS image sensor, different types of CMOS image sensors can be manufactured using the same CMOS process technology, thereby reducing manufacturing costs. Therefore, with technological development, there is increasing demand for CMOS image sensors capable of realizing high-resolution images.

In addition, image sensors can respond to infrared or ultraviolet light that is invisible to the human eye. Therefore, when necessary, visible light should be blocked and only infrared or ultraviolet light should be transmitted. In this case, infrared or ultraviolet pixels are additionally used.

In Korean Patent Application Publication No. 10-2010-0079088, a technology for detecting visible light using a quantum dot lens instead of a microlens and a color filter is disclosed. However, this technology has problems in that the process is complicated and infrared or ultraviolet light cannot be detected. In Korean Patent Application Publication No. 10-2015-0118885, a technology relating to an organic photodiode (OPD) structure, in which organic materials, quantum dots, and group III-V materials are used as substances for detecting infrared light, is disclosed. In the organic photodiode (OPD) structure, light is adsorbed to form electron-hole pairs (EHPs), and then current is generated through upper and lower electrodes. However, this technology has problems in that photoelectric conversion efficiency is low and the process is complicated.

Ludong Li discloses a method of generating electron-hole pairs by zinc oxide quantum dots (ZnO QDs) absorbing ultraviolet light. In this method, a wide-band gap material (e.g., ZnO QDs) is used as a channel. This method also has a problem in that the process is complicated.

In U.S. Pat. No. 9,635,325, silicon nitride (SiNx) acts as a luminescent material for energy-down-shift. In this technology, since visible light is excluded and only ultraviolet light is detected, there is a problem that it is difficult to form an image due to lack of optical light flux.

However, as described above, a photodiode (SOI, ZnO nano-pattern, $TiO_2$ nano-rod, graphene, and the like) having high sensitivity in a wavelength band of infrared or ultraviolet light was used as an image sensor to detect infrared or ultraviolet light. However, the manufacturing process of the photodiode is complicated. In addition, there is a limitation in that only the quantity of infrared or ultraviolet light can be measured using the photodiode.

DISCLOSURE

Technical Problem

Therefore, the present invention has been made in view of the above problems, and it is one object of the present invention to provide an image sensor capable of displaying (imaging) based on the amount of infrared or ultraviolet light using a quantum dot layer.

It is another object of the present invention to provide an image sensor capable of detecting both visible light and infrared/ultraviolet light using a quantum dot layer that absorbs light in the ultraviolet or infrared wavelength band and emits visible light.

It is yet another object of the present invention to provide an image sensor capable of detecting infrared or ultraviolet light manufactured using a simple process of mounting a quantum dot layer on a conventional image sensor.

Technical Solution

In accordance with one aspect of the present invention, provided is an image sensor including a quantum dot layer, wherein the image sensor includes photoelectric conversion elements formed on a substrate to correspond to a plurality of pixel regions; a wiring layer formed on the substrate on which the photoelectric conversion elements are formed; color filters formed on the wiring layer to correspond to the photoelectric conversion elements; and a quantum dot layer formed on the color filters and absorbing light and emitting visible light having a specific range of wavelengths converted from the absorbed light.

When first and second visible light are incident on the photoelectric conversion elements, the first visible light may be visible light passing through the quantum dot layer, and the second visible light may be visible light having a specific range of wavelengths emitted from the light-absorbed quantum dot layer.

The quantum dot layer may convert light in the ultraviolet wavelength band into the second visible light via energy-down-shift and emit the second visible light.

The quantum dot layer may convert light in the infrared wavelength band into the second visible light via energy-up-shift and emit the second visible light.

The quantum dot layer may be a blue quantum dot layer that transmits blue, green, and red light in the visible light wavelength band and selectively absorbs light in the ultraviolet or infrared wavelength band to amplify blue visible light.

The quantum dot layer may be a red quantum dot layer that transmits blue, green, and red light in the visible light wavelength band and selectively absorbs light in the ultraviolet or infrared wavelength band to amplify red visible light.

The quantum dot layer may be a green quantum dot layer that transmits blue, green, and red light in the visible light wavelength band and selectively absorbs light in the ultraviolet or infrared wavelength band to amplify green visible light.

The transmittance of the quantum dot layer may be controlled depending on the concentration of quantum dots.

The quantum dot layer may include at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof.

The quantum dot layer may include CdZnS/ZnS core/shell quantum dots or Mn-doped CdZnS/ZnS core/shell quantum dots.

The photoelectric conversion element may be a silicon-based photodiode.

The image sensor including a quantum dot layer may further include microlenses on the upper or lower part of the quantum dot layer.

In accordance with another aspect of the present invention, provided is an image sensor including quantum dots, wherein the image sensor includes photoelectric conversion elements formed on a substrate to correspond to a plurality of pixel regions; a wiring layer formed on the substrate on which the photoelectric conversion elements are formed; color filters formed on the wiring layer to correspond to the photoelectric conversion elements; and microlenses formed on the color filters, wherein at least one of the color filters includes quantum dots that absorb light and emit visible light having a specific range of wavelengths converted from the absorbed light.

Advantageous Effects

According to an embodiment of the present invention, an image sensor capable of displaying (imaging) based on the amount of light in the ultraviolet or infrared wavelength band (infrared/ultraviolet light) using a quantum dot layer can be manufactured.

According to an embodiment of the present invention, an image sensor capable of detecting both visible light and infrared/ultraviolet light using a quantum dot layer that absorbs light in the ultraviolet or infrared wavelength band and emits visible light can be manufactured.

According to an embodiment of the present invention, an image sensor capable of detecting light in the ultraviolet or infrared wavelength band can be manufactured using a simple process of mounting a quantum dot layer on a conventional image sensor.

DESCRIPTION OF DRAWINGS

FIG. 1A is a cross-sectional view of an image sensor including a quantum dot layer according to one embodiment of the present invention.

FIG. 1B is a cross-sectional view of an image sensor including a quantum dot layer according to another embodiment of the present invention.

FIG. 1C is a cross-sectional view of an image sensor including quantum dots according to yet another embodiment of the present invention.

FIG. 2 is a stereoscopic view of an image sensor including a quantum dot layer according to another embodiment of the present invention.

FIGS. 3A to 3C are diagrams illustrating a single pixel of an image sensor including a quantum dot layer according to an embodiment of the present invention.

FIGS. 4A to 4D show the matrixes of the red, green, and blue channels of an image obtained using an image sensor without a quantum dot layer and the matrixes of the red, green, and blue channels of an image obtained using an image sensor including a quantum dot layer according to an embodiment of the present invention.

FIG. 5 is a transmission electron microscope (TEM) image of an image sensor including a quantum dot layer according to an embodiment of the present invention.

FIG. 6 is a transmission electron microscope (TEM) and energy-dispersive X-ray spectroscopy (EDS) image of a quantum dot having a core/shell structure.

FIG. 7 is a graph showing the wavelength-dependent photoluminescence (PL) and absorbances (Abs) of quantum dots used in an image sensor including a quantum dot layer according to an embodiment of the present invention.

FIG. 8 is a graph showing the wavelength-dependent solar spectrum of an image sensor including a quantum dot layer according to an embodiment of the present invention.

FIG. 9 is an energy band diagram of CdZnS/ZnS core/shell quantum dots.

FIG. 10 is a graph showing the wavelength-dependent photoluminescence (PL) intensities and absorbances (Abs) of image sensors including a quantum dot layer manufactured using quantum dots of various concentrations according to an embodiment of the present invention.

FIG. 11 is a graph showing the wavelength-dependent photoluminescence (PL) intensities of image sensors including a quantum dot layer manufactured using quantum dots of various concentrations according to an embodiment of the present invention.

FIG. 12 is a graph showing the reverse bias-dependent current amounts of image sensors including a quantum dot layer manufactured using quantum dots of various concentrations according to an embodiment of the present invention.

FIG. 13 is a graph showing the wavelength-dependent responsivities of image sensors including a quantum dot layer manufactured using quantum dots of various concentrations according to an embodiment of the present invention.

FIG. 14 is a graph showing the characteristics of the transfer transistor, reset transistor, source follower transistor, and current source transistor of an image sensor including a quantum dot layer according to an embodiment of the present invention according to pulse operation.

FIG. 15 is a graph showing the wavelength-dependent voltage sensing margins ($R_{AV}$) of image sensors including a quantum dot layer according to an embodiment of the present invention.

FIG. 16 is a graph showing the light intensity-dependent voltage sensing margins ($R_{AV}$) of image sensors including a quantum dot layer according to an embodiment of the present invention.

FIG. 17A shows the red channels of images obtained using an image sensor including a quantum dot layer according to an embodiment of the present invention, and FIG. 17B shows the green channels of images obtained using an image sensor including a quantum dot layer according to an embodiment of the present invention.

FIG. 17C shows the blue channels of images obtained using an image sensor including a quantum dot layer according to an embodiment of the present invention.

FIG. 18 is a graph showing the voltage sensing margins ($\Delta V_{dark\text{-}photo}$) of an image sensor including a quantum dot layer according to an embodiment of the present invention, depending on sunlight irradiation times.

FIG. 19 includes images obtained using an image sensor including a quantum dot layer according to an embodiment of the present invention under conditions in which an object is irradiated with sunlight for various times.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, image sensors including a quantum dot layer according to embodiments of the present invention will be described with reference to FIGS. 1A to 1C.

FIGS. 1A to 1C are cross-sectional views of image sensors including a quantum dot layer according to embodiments of the present invention.

The image sensors including a quantum dot layer according to embodiments of the present invention include photoelectric conversion elements 120 formed on a substrate 110 to correspond to a plurality of pixel regions, a wiring layer 130 formed on the substrate on which the photoelectric conversion elements 120 are formed, color filters 140R, 140G, and 140B are formed on the wiring layer 130 to correspond to the photoelectric conversion elements 120, and a quantum dot layer 150 formed on the color filters 140R, 140G, and 140B and absorbing light and emitting visible light having a specific range of wavelengths converted from the absorbed light.

In the image sensors including a quantum dot layer according to embodiments of the present invention, first and second visible light P1 and P2 are incident on the photoelectric conversion elements 120. In this case, the first visible light P1 may be visible light passing through the quantum dot layer 150 and the color filters 140R, 140G, and 140B, and the second visible light P2 may be visible light having a specific range of wavelengths emitted from the light-absorbed quantum dot layer 150.

Therefore, the first visible light P1 may include visible light incident from the outside, and the second visible light P2 may include visible light generated by transforming light in the ultraviolet or infrared wavelength band incident from the outside. In this case, when the light in the ultraviolet or infrared wavelength band incident from the outside passes through the quantum dot layer 150, the light in the ultraviolet or infrared wavelength band is converted into visible light.

Therefore, the image sensor including a quantum dot layer according to an embodiment of the present invention may be manufactured through a simple process of mounting the quantum dot layer 150 on an existing image sensor. The image sensor of the present invention may detect the first visible light P1 (i.e., visible light incident from the outside) and the second visible light P2 (i.e., visible light generated by converting infrared or ultraviolet light incident from the outside when the infrared or ultraviolet light passes through the quantum dot layer 150).

In addition, the image sensor including a quantum dot layer according to an embodiment of the present invention may implement display (imaging) according to the amount of light in the ultraviolet or infrared wavelength band through the second visible light incident through the quantum dot layer 150.

The image sensor including a quantum dot layer according to an embodiment of the present invention may include an active pixel sensor array, and the active pixel sensor array may include a plurality of unit pixels arranged two-dimensionally in rows and columns.

An electrical signal may be generated by incident light in each of the unit pixels, and the unit pixel may include the photoelectric conversion elements 120 and logic elements, and the logic elements may include a transfer transistor (TX), a reset transistor (RX), a source follower transistor (SF), a current source transistor (CS), and a floating diffusion region (FD).

The arrangement of the logic elements and the photoelectric conversion elements 120 formed on the substrate of the image sensor including a quantum dot layer according to one embodiment of the present invention will be described in detail with reference to FIGS. 3A to 3C.

In addition, the image sensor including a quantum dot layer according to one embodiment of the present invention preferably further includes microlenses 160 formed on the upper or lower part of the quantum dot layer 150.

In FIGS. 1A to 1C, the same components are shown except for the positions of the microlenses 160 and the quantum dot layer 150, and, as such, the same components will be described with reference to FIG. 1A.

FIG. 1A is a cross-sectional view of an image sensor including a quantum dot layer according to one embodiment of the present invention.

The image sensor including a quantum dot layer according to one embodiment of the present invention may include the photoelectric conversion elements 120 formed on the substrate 110 to correspond to a plurality of pixel regions, the wiring layer 130 formed on the substrate on which the photoelectric conversion elements 120 are formed, the color filters 140R, 140G, and 140B formed on the wiring layer 130 to correspond to the photoelectric conversion elements, the quantum dot layer 150 formed on the color filters 140R, 140G, and 140B and absorbing light and emitting visible light having a specific range of wavelengths converted from the absorbed light, and the microlenses 160 formed on the quantum dot layer 150.

In the image sensor including a quantum dot layer according to one embodiment of the present invention, the microlenses 160 may be formed on the upper part of the quantum dot layer 150. In this case, since light is concentrated at the microlenses 160 and the light passes through the quantum dot layer 150, the amount of ultraviolet or infrared light absorbed in the quantum dot layer 150 is increased, thereby improving the sensitivity of the image sensor.

The image sensor includes the photoelectric conversion elements 120 formed on the substrate 110 to correspond to a plurality of pixel regions.

As the substrate 110, a substrate having n-type or p-type conductivity or an epitaxial substrate obtained by forming a p-type or n-type epitaxial layer on a bulk substrate may be used. An element separation layer (not shown) may be formed in the substrate 110 to separate an active region and a field region, and the photoelectric conversion elements 120 and the logic elements may be formed in the active region of the substrate 110.

In addition, a deep well (not shown) may be formed in the substrate 110. The deep well may act as a potential barrier so that charges generated at the deep portion of the substrate 110 do not flow into the photoelectric conversion elements 120, and may act as a crosstalk barrier to reduce crosstalk between pixels due to random drift of charges by increasing recombination between charges and holes.

In the photoelectric conversion elements 120, incident light is absorbed and charges corresponding to the amount of light are accumulated. As the photoelectric conversion elements 120, a photodiode, a phototransistor, a photogate, a pinned photodiode, or a combination thereof may be used. Preferably, a silicon-based photodiode may be used as the photoelectric conversion elements 120.

Preferably, the silicon-based photodiode may be an impurity region formed by doping the substrate 110 with impurities. The silicon-based photodiode may include N-type and P-type impurity regions. The N-type impurity region may be formed deep within the substrate 110, and the P-type impurity region may be thinly formed on the surface of the N-type impurity region.

The wiring layer 130 is formed on the substrate on which the photoelectric conversion elements 120 are formed.

Preferably, a plurality of insulating layers is formed on the upper part of the substrate 110 on which the photoelectric conversion elements 120 and the logic elements are formed, and each of the insulating layers may include the wiring layer 130 for electrical routing and/or shielding functions of the elements.

The insulating layers formed on the upper part of the photoelectric conversion elements 120 may be formed of an insulating material having a high transmittance to improve light transmittance, and may include a light transmitting part to improve the light transmittance of the upper part of the photoelectric conversion elements 120.

The wiring layer 130 may be connected to lower logic elements or other wiring through contacts (not shown), and may be formed in an area other than the area where the photoelectric conversion elements 120 are formed.

Therefore, the wiring layer 130 may be formed on the upper part of the logic elements of each unit pixel, and may block light from entering the region where the logic elements are formed.

The wiring layer 130 may include a plurality of metal wirings, and may be formed of a metal material such as tungsten (W) or copper (Cu).

The image sensor of the present invention includes the color filters 140R, 140G, and 140B formed on the wiring layer 130 to correspond to the photoelectric conversion elements 120. The color filters 140R, 140G, and 140B may include a red color filter 140R, a green color filter 140G, and a blue color filter 140B.

The color filters 140R, 140G, and 140B may include the red color filter 140R, the green color filter 140G, and the blue color filter 140B, depending on the pixels.

Red light contained in the visible light may pass through the red color filter 140R, and photoelectrons corresponding to red light may be generated in the photoelectric conversion elements 120 of a red pixel.

Green light contained in the visible light may pass through the green color filter 140G, and photoelectrons corresponding to green light may be generated in the photoelectric conversion elements 120 of a green pixel.

Blue light contained in the visible light may pass through the blue color filter 140B, and photoelectrons corresponding to blue light may be generated in the photoelectric conversion elements 120 of a blue pixel.

In addition, according to an embodiment, the color filters may include white (W), magenta (Mg), yellow (Y), or cyan (Cy).

The quantum dot layer 150 responsible for absorbing light and emitting visible light having a specific range of wavelengths converted from the absorbed light is formed on the color filters 140R, 140G, and 140B.

Preferably, the light absorbed in the quantum dot layer 150 may be light in the ultraviolet or infrared wavelength band.

The depth at which light incident from the outside enters the silicon-based photodiode varies depending on the wavelength range of the incident light.

In the case of light in the infrared wavelength band having a long wavelength (about 750 nm to 1,000 nm), the light penetrates into the substrate 110 located deeper than the silicon-based photodiode, thereby causing loss of light. As a result, the amount of light incident on the photoelectric conversion elements 120 may be reduced.

In addition, in the case of light in the ultraviolet wavelength band having high energy ($E \geq 3.1$ eV) and a short wavelength ($\lambda \leq 400$ nm), the light is detected only in the depleted thin upper silicon layer of the silicon-based photodiode, and thus the amount of incident light is reduced. As a result, the charge current efficiency associated with change in the amount of incident photons and the sensitivity of the image sensor may be very low.

However, the image sensor including a quantum dot layer according to one embodiment of the present invention includes the quantum dot layer 150 responsible for converting incident light in the ultraviolet or infrared wavelength band into visible light (i.e., second visible light) having a high sensitivity for a silicon-based photodiode. Therefore, the image sensor may detect light in the ultraviolet or infrared wavelength band. Thus, sensitivity for infrared or ultraviolet light may be improved.

In addition, the quantum dot layer 150 may convert light in the ultraviolet wavelength band into the second visible light via energy-down-shift and emit the second visible light.

More specifically, quantum dots included in the quantum dot layer 150 may absorb light in the ultraviolet wavelength band having a wavelength of about 400 nm. The absorbed light in the ultraviolet wavelength band may be converted into the second visible light P2 having a wavelength of about 380 nm to 800 nm by the quantum dots, and the second visible light P2 may be emitted from the quantum dot layer 150. Therefore, the quantum dot layer 150 is capable of converting incident light into light having a long wavelength via energy-down-shift.

In addition, the quantum dot layer 150 may convert light in the infrared wavelength band into the second visible light via energy-up-shift and emit the second visible light.

More specifically, quantum dots included in the quantum dot layer 150 may absorb light in the infrared wavelength band having a wavelength range of about 750 nm to 1,000 nm. The absorbed light in the infrared wavelength band may be converted into the second visible light P2 having a wavelength of about 380 nm to 800 nm by the quantum dots, and the second visible light P2 may be emitted from the quantum dot layer 150. Therefore, the quantum dot layer 150 is capable of converting incident light into light having a short wavelength via energy-up-shift.

In the image sensor including a quantum dot layer according to one embodiment of the present invention, the quantum dot layer 150 may be formed as any one of a red quantum dot layer including red quantum dots, a green quantum dot layer including green quantum dots, and a blue quantum dot layer including blue quantum dots.

When the quantum dot layer 150 is a blue quantum dot layer, the blue quantum dot layer may transmit blue, green, and red light in the visible light wavelength band and selectively absorb light in the ultraviolet or infrared wavelength band to amplify blue visible light.

More specifically, when visible light is incident on an image sensor including a blue quantum dot layer, the red color filter 140R, the green color filter 140G, and the blue color filter 140B may transmit the visible light, and the first visible light P1 may be incident on the photoelectric conversion elements 120.

When light in the ultraviolet or infrared wavelength band is incident on an image sensor including a blue quantum dot layer, the blue quantum dot layer may absorb the light in the ultraviolet or infrared wavelength band and emit blue visible light (the second visible light P2). The red color filter 140R and the green color filter 140G may not transmit the blue visible light, and only the blue color filter 140B may transmit the blue visible light.

Therefore, only the first visible light P1 may be incident on the photoelectric conversion elements 120 corresponding to the red color filter 140R and the green color filter 140G, and the first and second visible light P1 and P2 may be incident on the photoelectric conversion element 120 corresponding to the blue color filter 140B. As a result, the amount of absorbed light may be increased, resulting in a difference in light intensity or light quantity (flux).

When the quantum dot layer 150 is a red quantum dot layer, the red quantum dot layer may transmit blue, green, and red light in the visible light wavelength band and selectively absorb light in the ultraviolet or infrared wavelength band to amplify red visible light.

More specifically, when visible light is incident on an image sensor including a red quantum dot layer, the red color filter 140R, the green color filter 140G, and the blue color filter 140B may transmit the visible light, and the first visible light P1 may be incident on the photoelectric conversion elements 120.

When light in the ultraviolet or infrared wavelength band is incident on an image sensor including a red quantum dot layer, the red quantum dot layer may absorb the light in the ultraviolet or infrared wavelength band and emit red visible light (the second visible light P2). The blue color filter 140B and the green color filter 140G may not transmit the red visible light, and only the red color filter 140R may transmit the red visible light.

Therefore, only the first visible light P1 may be incident on the photoelectric conversion elements 120 corresponding to the blue color filter 140B and the green color filter 140G, and the first and second visible light P1 and P2 may be incident on the photoelectric conversion element 120 corresponding to the red color filter 140R. As a result, the amount of absorbed light may be increased, resulting in a difference in light intensity or light quantity (flux).

When the quantum dot layer 150 is a green quantum dot layer, the green quantum dot layer may transmit blue, green, and red light in the visible light wavelength band and selectively absorb light in the ultraviolet or infrared wavelength band to amplify green visible light.

More specifically, when visible light is incident on an image sensor including a green quantum dot layer, the red color filter 140R, the green color filter 140G, and the blue color filter 140B may transmit the visible light, and the first visible light P1 may be incident on the photoelectric conversion elements 120.

When light in the ultraviolet or infrared wavelength band is incident on an image sensor including a green quantum dot layer, the green quantum dot layer may absorb the light in the ultraviolet or infrared wavelength band and emit green visible light (the second visible light P2). The blue color filter 140B and the red color filter 140R may not transmit the green visible light, and only the green color filter 140G may transmit the green visible light.

Therefore, only the first visible light P1 may be incident on the photoelectric conversion elements 120 corresponding to the blue color filter 140B and the red color filter 140R, and the first and second visible light P1 and P2 may be incident on the photoelectric conversion element 120 corresponding to the green color filter 140G. As a result, the amount of absorbed light may be increased, resulting in a difference in light intensity or light quantity (flux).

In FIG. 1A, a blue quantum dot layer is used as the quantum dot layer 150. However, the present invention is not limited thereto, and a red quantum dot layer or a green quantum dot layer may also be used.

In addition, the transmittance of the quantum dot layer 150 may be controlled by adjusting the concentration of quantum dots.

When the concentration of quantum dots in the quantum dot layer 150 is increased, transmittance in the visible light wavelength band may be reduced due to light scattering generated in the quantum dot layer 150.

Therefore, when the concentration of quantum dots included in the quantum dot layer 150 is increased, the light intensity or light quantity (flux) of the first visible light P1 is decreased, so that the influence of the second visible light P2 increases. As a result, the pixel intensity difference in the photoelectric conversion elements 120 may be clearly confirmed.

More specifically, in the case of the first visible light P1 incident on the image sensor including a quantum dot layer according to an embodiment of the present invention, the transmittance of light in the visible light wavelength band may be decreased by the quantum dot layer 150. On the other hand, in the case of the second visible light P2, light in the ultraviolet or infrared wavelength band may be converted into light in the visible light wavelength band in the quantum dot layer 150, and the light in the visible light wavelength band may be emitted from the quantum dot layer 150. Therefore, the transmittance of the second visible light P2 may be increased.

Therefore, the transmittance of light in the visible light wavelength band incident on the image sensor including a quantum dot layer according to an embodiment of the present invention is decreased, and the transmittance of light in the ultraviolet or infrared wavelength band is increased. As a result, pixel intensity may be clarified.

The quantum dot layer 150 may include a plurality of quantum dots, and the quantum dots may include red, green, or blue quantum dots.

The quantum dot may include at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof.

Preferably, CdZnS/ZnS core/shell quantum dots or Mn-doped CdZnS/ZnS core/shell quantum dots are used to form the quantum dot layer 150. The CdZnS/ZnS core/shell quantum dots emit blue light, and the Mn-doped CdZnS/ZnS core/shell quantum dots emit yellow-orange light.

The external quantum yield of CdZnS/ZnS core/shell quantum dots may be increased by adjusting the diameter of the CdZnS quantum dot core and the thickness of the ZnS quantum dot shell.

To prepare the CdZnS/ZnS core/shell quantum dots, 7.5 mL of oleic acid (OA) was injected into a solution containing CdO and Zn $(acet)_2$, and heat treatment was performed at room temperature (RT) to prepare a solution containing Cd $(OA)_2$ and Zn $(OA)_2$. Then, 5 ml of 1-octadecene (1-ODE) was injected into the prepared solution containing Cd $(OA)_2$ and Zn $(OA)_2$, followed by heat treatment at 150° C. Thereafter, a first sulfur (S) precursor was added to the solution, and heat treatment was performed at 300° C. to prepare a solution containing Cd $(OA)_2$, Zn $(OA)_2$, and sulfur. Then, a second sulfur precursor was added to the solution containing Cd $(OA)_2$, Zn $(OA)_2$, and sulfur, and heat treatment was performed at 300° C. for 8 minutes to form CdZnS core quantum dots. Finally, the CdZnS core quantum dots were heat-treated at 310° C. for 40 minutes to prepare CdZnS/ZnS core/shell quantum dots.

The image sensor of the present invention includes the microlenses 160 formed on the quantum dot layer 150.

The microlenses 160 may be formed to correspond to the photoelectric conversion elements 120, and may have a predetermined radius of curvature.

The radius of curvature of the microlenses 160 may vary depending on the wavelength of light incident on each pixel, and the microlenses 160 may change the path of light incident on a region other than the photoelectric conversion elements 120 to concentrate light on the photoelectric conversion elements 120.

FIG. 1B is a cross-sectional view of an image sensor including a quantum dot layer according to another embodiment of the present invention.

The image sensor including a quantum dot layer according to another embodiment of the present invention includes the photoelectric conversion elements 120 formed on the substrate 110 to correspond to a plurality of pixel regions, the wiring layer 130 formed on the substrate on which the photoelectric conversion elements 120 are formed, the color filters 140R, 140G, and 140B formed on the wiring layer 130 to correspond to the photoelectric conversion elements, the microlenses 160 formed on the color filters 140R, 140G, and 140B, and the quantum dot layer 150 formed on the microlenses 160 and absorbing light and emitting visible light having a specific range of wavelengths converted from the absorbed light.

FIG. 1B is the same as FIG. 1A, except that the quantum dot layer 150 is formed on the upper part of the microlenses 160. Therefore, description of the same components will be omitted.

The image sensor including a quantum dot layer according to another embodiment of the present invention may be manufactured using a simple process of mounting a quantum dot layer on a conventional image sensor. In the image sensor of the present invention, the quantum dot layer 150 is formed on the upper part of the microlenses 160, and may detect ultraviolet or infrared light.

Preferably, the quantum dot layer 150 of the image sensor including a quantum dot layer according to another embodiment of the present invention may include a transparent substrate and quantum dots formed on the transparent substrate.

Glass or quartz may be use as the transparent substrate. Preferably, quartz having a transmittance of about 90% at all wavelengths is used as the transparent substrate.

The quantum dots may be formed on the transparent substrate using evaporation or coating.

FIG. 1C is a cross-sectional view of an image sensor including quantum dots according to yet another embodiment of the present invention.

The image sensor including quantum dots according to yet another embodiment of the present invention includes the photoelectric conversion elements 120 formed on the substrate 110 to correspond to a plurality of pixel regions, the wiring layer 130 formed on the substrate on which the photoelectric conversion elements 120 are formed, the color filters 140R, 140G, and 140B formed on the wiring layer 130 to correspond to the photoelectric conversion elements 120, and the microlenses 160 formed on the color filters 140R, 140G, and 140B, wherein at least one of the color filters 140R, 140G, and 140B includes quantum dots 151 that absorb light and emit visible light having a specific range of wavelengths converted from the absorbed light.

FIG. 1C is the same as FIG. 1A, except that the quantum dots 151 are included in the color filters 140R, 140G, and 140B. Therefore, description of the same components will be omitted.

In the image sensor including quantum dots according to another embodiment of the present invention, the quantum dots 151 are blended with the color filters 140R, 140G, and 140B to form a single layer, so that the thickness of the image sensor capable of detecting ultraviolet or infrared light may be reduced.

FIG. 2 is a stereoscopic view of an image sensor including a quantum dot layer according to another embodiment of the present invention.

Referring to FIG. 2, an infrared or ultraviolet camera may be manufactured using the image sensor including a quantum dot layer according to another embodiment of the present invention manufactured using a simple process of mounting a quantum dot layer (Quartz glass with QDs film) on a conventional image sensor (3M pixel CIS).

FIGS. 3A to 3C are diagrams illustrating a single pixel of an image sensor including a quantum dot layer according to an embodiment of the present invention.

FIG. 3A is a circuit diagram showing a single pixel of an image sensor including a quantum dot layer according to an embodiment of the present invention, FIG. 3B is a stereoscopic view of the single pixel, and FIG. 3C is an optical microscope image of the single pixel.

Referring to FIGS. 3A to 3C, the single pixel of an image sensor including a quantum dot layer according to an embodiment of the present invention may include photoelectric conversion elements (n$^+$-doped photodiode with QDs) and logic elements.

The logic element may include a transfer transistor (TX), a reset transistor (RX), a source follower transistor (SF), a current source transistor (CS), and a floating diffusion region (FD).

In the photoelectric conversion element (n$^+$-doped photodiode with QDs), photo charges are generated and accumulated in proportion to the amount of light incident from the outside. The transfer transistor (TX) may transfer electric charges accumulated in the photoelectric conversion element (n$^+$-doped photodiode with QDs) to a floating diffusion region (FD).

In addition, the floating diffusion region (FD) cumulatively stores electric charges transferred from the photoelectric conversion element (n$^+$-doped photodiode with QDs), and the source follower transistor (SF) may be controlled depending on the amount of photo charges accumulated in the floating diffusion region (FD).

In addition, the source follower transistor (SF) may serve as a source follower buffer amplifier in combination with a constant current source (not shown) located outside the unit pixel, and may amplify the potential change in the floating diffusion region (FD) and output the amplified potential change to the output line (Vout).

In addition, the current source transistor (CS) may select a unit pixel to read in row units. When the current source transistor (CS) is turned on, the power supply voltage (VDD) supplied to the drain electrode of the source follower transistor (SF) may be transferred to the drain electrode of the current source transistor (CS).

In addition, the reset transistor (RX) may periodically reset the electric charges accumulated in the floating diffusion region (FD). More specifically, the drain electrode of the reset transistor (RX) may be connected to the floating diffusion region (FD), and the source electrode may be connected to the power supply voltage (VDD).

When the reset transistor (RX) is turned on, the power supply voltage (VDD) supplied to the source electrode of the reset transistor (RX) may be transferred to the floating diffusion region (FD), so that the electric charges accumulated in the floating diffusion region (FD) may be discharged and the floating diffusion region (FD) may be reset.

FIGS. 4A to 4D show the matrixes of the red, green, and blue channels of an image obtained using an image sensor without a quantum dot layer and the matrixes of the red, green, and blue channels of an image obtained using an image sensor including a quantum dot layer according to an embodiment of the present invention.

In FIGS. 4A to 4D, to compare an image obtained using an image sensor without a quantum dot layer and an image sensor including a quantum dot layer according to an embodiment of the present invention, all pixel intensity differences were obtained at the same location.

FIG. 4A shows matrixes obtained from each channel after separating red, green, and blue channels from each other, FIG. 4B is a matrix showing the channels of an image obtained using an image sensor including a quantum dot layer according to an embodiment of the present invention, FIG. 4C is a matrix showing the channels of an image obtained using an image sensor without a quantum dot layer, and FIG. 4D is a matrix showing channels calculated by subtracting the channels of the image obtained using an image sensor without a quantum dot layer from the channels of the image obtained using an image sensor including a quantum dot layer according to an embodiment of the present invention.

Referring to FIGS. 4A to 4D, if $A_{xy,with\ QD} - A_{xy,w/o\ QD} < 0$, in particular, for the red and green channels, the pixel intensity is reduced due to light scattering by the quantum dot layer (e.g., core/shell QDs).

The pixel intensity was set to zero to eliminate the scattering effect.

If $A_{xy,with\ QD} - A_{xy,w/o\ QD} > 0$, in particular, for the blue channel, the pixel intensity is increased by the quantum dot layer (e.g., core/shell QDs).

FIG. 5 is a transmission electron microscope (TEM) image of an image sensor including a quantum dot layer according to an embodiment of the present invention.

Referring to FIG. 5, a quantum dot layer having a thickness of 17.3 nm is uniformly formed on the upper part of the photoelectric conversion elements, and $Cd_{0.5}Zn_{0.5}S/ZnS$ core/shell quantum dots included in the quantum dot layer have a uniform size.

FIG. 6 is a transmission electron microscope (TEM) and energy-dispersive X-ray spectroscopy (EDS) image of a quantum dot having a core/shell structure.

Referring to FIG. 6, $Cd_{0.5}Zn_{0.5}S/ZnS$ core/shell quantum dots are formed.

FIG. 7 is a graph showing the wavelength-dependent photoluminescence (PL) and absorbances (Abs) of quantum dots used in an image sensor including a quantum dot layer according to an embodiment of the present invention.

In FIG. 7, $Mn^{2+}$-doped $Cd_{0.5}Zn_{0.5}S/ZnS$ core/shell quantum dots emitting yellow-orange light are used as the quantum dots included in a quantum dot layer.

Referring to FIG. 7, $Mn^{2+}$-doped $Cd_{0.5}Zn_{0.5}S/ZnS$ core/shell quantum dots absorb ultraviolet light and emit blue light. In addition to blue light, the quantum dots can emit yellow-orange light with ~583 nm peaks by increasing the Stokes shift through energy-tuning-effect.

FIG. 8 is a graph showing the wavelength-dependent solar spectrum of an image sensor including a quantum dot layer according to an embodiment of the present invention.

Referring to FIG. 8, the quantum dot layer induces energy-down-shift by which absorbed ultraviolet light is converted into visible light (e.g., blue light) and energy-up-shift by which absorbed infrared light is converted into visible light (e.g., blue light).

FIG. 9 is an energy band diagram of CdZnS/ZnS core/shell quantum dots.

Referring to FIG. 9, CdZnS/ZnS core/shell quantum dots absorb ultraviolet light and emit blue visible light.

FIG. 10 is a graph showing the wavelength-dependent photoluminescence (PL) intensities and absorbances (Abs) of image sensors including a quantum dot layer manufactured using quantum dots of various concentrations according to an embodiment of the present invention.

In FIG. 10, a blue quantum dot layer including CdZnS/ZnS core/shell quantum dots is used, and the concentrations of the blue quantum dots are set to 0.1 wt %, 0.2 wt %, 0.3 wt %, 0.4 wt %, and 0.5 wt %.

Referring to FIG. 10, as the concentration of the quantum dots included in the quantum dot layer increases, the absorbance of the image sensor increases.

FIG. 11 is a graph showing the wavelength-dependent photoluminescence (PL) intensities of image sensors including a quantum dot layer manufactured using quantum dots of various concentrations according to an embodiment of the present invention.

In FIG. 11, a blue quantum dot layer including CdZnS/ZnS core/shell quantum dots is used, and the concentrations of the blue quantum dots are set to 0.1 wt %, 0.2 wt %, 0.3 wt %, 0.4 wt %, and 0.5 wt %.

Referring to FIG. 11, as the concentration of the quantum dots included in the quantum dot layer increases, the photoluminescence intensity of the image sensor increases.

FIG. 12 is a graph showing the reverse bias-dependent current amounts of image sensors including a quantum dot layer manufactured using quantum dots of various concentrations according to an embodiment of the present invention.

In FIG. 12, a blue quantum dot layer including CdZnS/ZnS core/shell quantum dots is used, and the experimental conditions are as follows: dark-state, without a quantum dot layer (w/o QDs), quantum dots having a concentration of 0.1 wt %, quantum dots having a concentration of 0.2 wt %, quantum dots having a concentration of 0.3 wt %, quantum dots having a concentration of 0.4 wt %, and quantum dots having a concentration of 0.5 wt %.

In addition, in FIG. 12, a wavelength of 365 nm and ultraviolet intensity per unit area of 355 μW/cm² are used.

Referring to FIG. 12, as the concentration of quantum dots included in an image sensor including a quantum dot layer according to an embodiment of the present invention increases, the amount of photocurrent increases at a wavelength of 365 nm. When the image sensor includes quantum dots in a concentration of 0.5 wt %, the current amount increases from 0.17 μA to 0.68 μA at a reverse bias of 15V.

FIG. 13 is a graph showing the wavelength-dependent responsivities of image sensors including a quantum dot layer manufactured using quantum dots of various concentrations according to an embodiment of the present invention.

In FIG. 13, blue quantum dots are used, and the experimental conditions are as follows: without a quantum dot layer (w/o QDs), quantum dots having a concentration of 0.1 wt %, quantum dots having a concentration of 0.2 wt %, quantum dots having a concentration of 0.3 wt %, quantum dots having a concentration of 0.4 wt %, and quantum dots having a concentration of 0.5 wt %.

Responsivity is calculated by [Equation 1] below.

$$\text{Responsivity} = \frac{I_{ph} \ (A)}{E \ (W/cm^2) \times A \ (cm^2)} \quad \text{[Equation 1]}$$

Referring to FIG. 13, as the concentration of quantum dots included in an image sensor including a quantum dot layer according to an embodiment of the present invention increases, the responsivity of photoelectric conversion elements increases. In particular, when quantum dots having a concentration of 0.5 wt % are used, the responsivity (0.78 A/W) is dramatically increased at a wavelength of 365 nm.

FIG. 14 is a graph showing the characteristics of the transfer transistor, reset transistor, source follower transistor, and current source transistor of an image sensor including a quantum dot layer according to an embodiment of the present invention according to pulse operation.

Referring to FIG. 14, it can be seen that the reset transistor is turned on to completely reset the floating diffusion region (0 to 210 μs).

In addition, the transfer transistor is turned on and the reset transistor is turned off to transfer electrons to the floating diffusion region (210 to 460 μs) of photoelectric conversion elements. The transfer transistor and the reset transistor are turned off to read electrons transferred from the photoelectric conversion elements to the floating diffusion region (460 to 520 μs).

FIG. 15 is a graph showing the wavelength-dependent voltage sensing margins ($R_{AV}$) of image sensors including a quantum dot layer according to an embodiment of the present invention.

In FIG. 15, a blue quantum dot layer including CdZnS/ZnS core/shell quantum dots is used, and the concentrations of the blue quantum dots are set to 0.1 wt %, 0.2 wt %, 0.3 wt %, 0.4 wt %, and 0.5 wt %.

Voltage sensing margin ($R_{\Delta V}$) is calculated by [Equation 2] and [Equation 3].

$$\Delta V_{dark-photo} = V_{dark} - V_{photo} \qquad \text{[Equation 2]}$$

$$R_{\Delta V}[\%] = \frac{\Delta V_{dark-photo\ with\ QDs}\ [V]}{\Delta V_{dark-photo\ without\ QDs}\ [V]} \times 100[\%] \qquad \text{[Equation 3]}$$

Referring to FIG. 15, when quantum dots having a concentration of 0.5 wt % are used, the ratio of $\Delta V_{dark-photo}$ at a wavelength of 365 nm is increased by 194.66%. The voltage sensing margin of an image sensor including a quantum dot layer according to an embodiment of the present invention is increased by about two times due to the quantum dot layer.

In addition, the voltage sensing margin is increased in an ultraviolet light region of 450 nm or less.

FIG. 16 is a graph showing the light intensity-dependent voltage sensing margins ($R_{\Delta V}$) of image sensors including a quantum dot layer according to an embodiment of the present invention.

In FIG. 16, a blue quantum dot layer including CdZnS/ZnS core/shell quantum dots is used, and wavelengths (λ) are set to 254 nm, 365 nm, 450 nm, 551 nm, and 658 nm.

Referring to FIG. 16, the blue quantum dots exhibit high voltage sensing margins in the ultraviolet light wavelength, and exhibit the highest voltage sensing margin at a wavelength of 365 nm.

FIG. 17A shows the red channels of images obtained using an image sensor including a quantum dot layer according to an embodiment of the present invention, and FIG. 17B shows the green channels of images obtained using an image sensor including a quantum dot layer according to an embodiment of the present invention.

In FIGS. 17A and 17B, a blue quantum dot layer including CdZnS/ZnS core/shell quantum dots is used.

Referring to FIGS. 17A and 17B, most pixel intensities represent zero. The pixel intensity of the red channel of an image obtained using an image sensor including a quantum dot layer according to an embodiment of the present invention has a lower value that that of the red channel of an image obtained using an image sensor without a quantum dot layer.

FIG. 17C shows the blue channels of images obtained using an image sensor including a quantum dot layer according to an embodiment of the present invention.

In FIG. 17C, a blue quantum dot layer including CdZnS/ZnS core/shell quantum dots is used.

Referring to FIG. 17C, as the amount of ultraviolet light irradiated on the doll increases, the intensity of blue light emitted from the quantum dot layer increases. The emitted blue light is reabsorbed to photoelectric conversion elements through color filters.

FIG. 18 is a graph showing the voltage sensing margins ($\Delta V_{dark-photo}$) of an image sensor including a quantum dot layer according to an embodiment of the present invention, depending on sunlight irradiation times.

In FIG. 18, a blue quantum dot layer including CdZnS/ZnS core/shell quantum dots is used.

In clear weather with a high ultraviolet index of UV 3, an image sensor including a quantum dot layer according to an embodiment of the present invention has a high voltage sensing margin of 0.903 V. In cloudy weather with a low ultraviolet index of UV 1, the image sensor has a relatively low voltage sensing margin.

In addition, in both clear and cloudy weather, the image sensor including a quantum dot layer according to an embodiment of the present invention has a higher voltage sensing margin than that of an image sensor without a quantum dot layer.

FIG. 19 includes images obtained using an image sensor including a quantum dot layer according to an embodiment of the present invention under conditions in which an object is irradiated with sunlight for various times.

In FIG. 19, a blue quantum dot layer including CdZnS/ZnS core/shell quantum dots is used.

Referring to FIG. 19, in the case of an image obtained using an image sensor including a quantum dot layer according to an embodiment of the present invention, when the intensities of ultraviolet light per unit area are converted into energy values (1.785 µW/cm$^2$, 2.650 µW/cm$^2$, 2,879 µW/cm$^2$, 2,114 µW/cm$^2$, 1,185 µW/cm$^2$, and 442 µW/cm$^2$), as the energy values increase, the intensity of blue light emitted from the quantum dot layer is increased. In addition, the emitted blue light is reabsorbed by photoelectric conversion elements through color filters.

Meanwhile, embodiments of the present invention disclosed in the present specification and drawings are only provided to help understanding of the present invention and the present invention is not limited to the embodiments. It will be apparent to those skilled in the art that various modifications can be made to the above-described exemplary embodiments of the present invention without departing from the spirit or scope of the invention.

The invention claimed is:

1. An image sensor comprising a quantum dot layer, comprising:
   photoelectric conversion elements formed on a substrate to correspond to a plurality of pixel regions;
   a wiring layer formed on the substrate on which the photoelectric conversion elements are formed;
   color filters formed on the wiring layer to correspond to the photoelectric conversion elements; and
   a quantum dot layer formed on the color filters and configured to:
      absorb light in an infrared wavelength band and an ultraviolet wavelength band while passing first visible light having predetermined wavelengths, and
      emit second visible light having a specific range of wavelengths converted from the ultraviolet wavelength band of the absorbed light via energy-down-shift,
   wherein the first visible light and the second visible light are incident on the photoelectric conversion elements, and
   wherein the photoelectric conversion elements detect visible light based on the first visible light and detect ultraviolet light based on the second visible light,
   wherein a transmittance of the quantum dot layer is controlled depending on a concentration of quantum dots,
   wherein the quantum dot layer decreases a transmittance of the first visible light and increases a transmittance of the second visible light, and
   wherein the substrate includes a deep well which acts as a crosstalk barrier to reduce crosstalk between pixels due to random drift of charges by increasing recombination between charges and holes.

2. The image sensor comprising a quantum dot layer according to claim 1, wherein the quantum dot layer converts light in the ultraviolet wavelength band into the second visible light via the energy-down-shift.

3. The image sensor comprising a quantum dot layer according to claim 1, wherein the quantum dot layer converts light in an infrared wavelength band into the second visible light via energy-up-shift and emits the second visible light.

4. The image sensor comprising a quantum dot layer according to claim 1, wherein the quantum dot layer is a blue quantum dot layer that transmits blue, green, and red light in a visible light wavelength band and selectively absorbs light in an ultraviolet or infrared wavelength band to amplify blue visible light.

5. The image sensor comprising a quantum dot layer according to claim 1, wherein the quantum dot layer is a red quantum dot layer that transmits blue, green, and red light in a visible light wavelength band and selectively absorbs light in an ultraviolet or infrared wavelength band to amplify red visible light.

6. The image sensor comprising a quantum dot layer according to claim 1, wherein the quantum dot layer is a green quantum dot layer that transmits blue, green, and red light in a visible light wavelength band and selectively absorbs light in an ultraviolet or infrared wavelength band to amplify green visible light.

7. The image sensor comprising a quantum dot layer according to claim 1, wherein the quantum dot layer comprises at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof.

8. The image sensor comprising a quantum dot layer according to claim 7, wherein the quantum dot layer comprises CdZnS/ZnS core/shell quantum dots or Mn-doped CdZnS/ZnS core/shell quantum dots.

9. The image sensor comprising a quantum dot layer according to claim 1, wherein the photoelectric conversion element is a silicon-based photodiode.

10. The image sensor comprising a quantum dot layer according to claim 1, further comprising microlenses on the quantum dot layer.

* * * * *